(12) United States Patent
Xi et al.

(10) Patent No.: US 10,989,973 B2
(45) Date of Patent: Apr. 27, 2021

(54) DISPLAY PANEL AND 3D PRINTING DEVICE

(71) Applicant: Shanghai AVIC OPTO Electronics Co., Ltd., Shanghai (CN)

(72) Inventors: Kerui Xi, Shanghai (CN); Chen Wang, Shanghai (CN); Feng Qin, Shanghai (CN); Xiaohe Li, Shanghai (CN); Jine Liu, Shanghai (CN); Tingting Cui, Shanghai (CN)

(73) Assignee: SHANGHAI AVIC OPTO ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/533,634

(22) Filed: Aug. 6, 2019

(65) Prior Publication Data

US 2019/0361307 A1 Nov. 28, 2019

(30) Foreign Application Priority Data

Sep. 7, 2018 (CN) .......................... 201811041756.5

(51) Int. Cl.
*G02F 1/1362* (2006.01)
*B33Y 30/00* (2015.01)
(Continued)

(52) U.S. Cl.
CPC ...... *G02F 1/136286* (2013.01); *B29C 64/286* (2017.08); *B33Y 30/00* (2014.12);
(Continued)

(58) Field of Classification Search
CPC .......... G02F 1/136286; G02F 1/13394; G02F 1/136209; G02F 1/136227; G02F 1/1368; B33Y 30/00; B29C 64/286; H01L 27/124
(Continued)

(56) References Cited

U.S. PATENT DOCUMENTS

2007/0242009 A1* 10/2007 Su ........................ G09G 3/3648
345/87
2008/0068516 A1* 3/2008 Mori .................... G09G 3/3648
348/790
(Continued)

FOREIGN PATENT DOCUMENTS

CN 107179634 A 9/2017
CN 107844219 A 3/2018

OTHER PUBLICATIONS

English Machine Translation of CN107179634 (Year: 2017).*

*Primary Examiner* — Dzung Tran
(74) *Attorney, Agent, or Firm* — Alston & Bird LLP

(57) ABSTRACT

A 3D printed display panel includes two opposing substrates and a black matrix formed on one of the substrates. The light proof areas of the black matrix include multiple first portions, multiple second portions and multiple third portions arranged to form a grid structure. The first portions and the third portions are alternately arranged in a direction of the scanning lines, the second portions and the third portions are alternately arranged in a direction of the data lines. Meshes of the grid structure are aperture zones of the black matrix. The aperture zones are in one-to-one correspondence with the pixel units. A vertical projections of the scanning lines and the data lines on the second substrate are located in the lightproof areas; where a minimum width of one first portion is X, a minimum width of one second portion is Y, and $|X-Y| \leq 2$ μm.

11 Claims, 11 Drawing Sheets

(51) Int. Cl.
*B29C 64/286* (2017.01)
*G02F 1/1339* (2006.01)
*G02F 1/1368* (2006.01)
*H01L 27/12* (2006.01)

(52) U.S. Cl.
CPC ........ *G02F 1/1368* (2013.01); *G02F 1/13394* (2013.01); *G02F 1/136209* (2013.01); *G02F 1/136227* (2013.01); *H01L 27/124* (2013.01); *G02F 2202/103* (2013.01); *H01L 27/1222* (2013.01)

(58) Field of Classification Search
USPC .......................................................... 257/72
See application file for complete search history.

(56) References Cited

U.S. PATENT DOCUMENTS

| | | | | |
|---|---|---|---|---|
| 2008/0284967 | A1* | 11/2008 | Oh ................... | G02F 1/134363 349/144 |
| 2010/0118221 | A1* | 5/2010 | Kim ................. | G02F 1/136286 349/39 |
| 2010/0321602 | A1* | 12/2010 | Liu ................... | G02F 1/136286 349/42 |
| 2015/0362809 | A1* | 12/2015 | Wang ............... | G02F 1/136286 257/532 |

\* cited by examiner

DISPLAY PANEL AND 3D PRINTING DEVICE

CROSS-REFERENCES TO RELATED APPLICATIONS

This application claims priority to a Chinese patent application No. CN 201811041756.5 filed at CNIPA on Sep. 7, 2018, disclosure of which is incorporated herein by reference in its entirety.

TECHNICAL FIELD

The present disclosure relates to 3D printing techniques and in particular, to a display panel and a 3D printing device.

BACKGROUND

The rapid prototyping (RP) technology (also referred as rapid prototyping manufacturing (RPM)), also known as 3D printing, is a high-tech manufacturing technology based on material stacking. Specifically, based on three-dimensional (3D) model data of desired parts or objects, a physical object or a physical model may be manufactured by a prototyping device in a manner of material accumulation. The 3D printing technology has gradually grown popular and has been rapidly developed in recent years from its advantages including largely reduced production costs, improved utilization rate of raw materials and energy, easy customization according to demands, and great saving of production time.

At present, a conventional liquid crystal display panel is generally applied to 3D printing. Specifically, a resin is coated on a pallet in advance, and the conventional display panel is used as a photomask, so that the ultraviolet light is controlled to pass through the display panel and enter the resin to cure the resin. In such a way, according to the pattern to be printed, the deflection angle of the liquid crystal molecules in each pixel unit of the display panel is controlled, and thus the ultraviolet light transmission in each pixel unit is controlled, so that the resin may be patterned accordingly. However, configuration of the existing display panel does not match the new printing design, leaving failed dark spaces outside light spots formed on the resin after the ultraviolet light transmits through the display panel mask. Therefore, the light may not sufficiently cover the patterned resin, resulting insufficient curing of resin in those failed spaces. The failed spaces occur as pits on the final 3D printed product, failing to meet the users' demands.

SUMMARY

The present disclosure provides a display panel and a 3D printing device to avoid unnecessary pits on 3D printed products, improve the quality of 3D printed products and improve the user's experience.

In a first aspect, embodiments of the present disclosure provide a display panel. The display panel includes:

a first substrate, where multiple scanning lines and multiple data lines are formed on the first substrate, and the multiple scanning lines and the multiple data lines intersect insulatively to define multiple pixel units; and a second substrate disposed opposite to the first substrate, and a black matrix is formed on the second substrate;

the black matrix includes multiple first portions, multiple second portions and multiple third portions, the multiple first portions and the multiple third portions are alternately arranged in a first direction in which the multiple scanning lines extend, the multiple second portions and the multiple third portions are alternately arranged in a second direction in which the multiple data lines extend, and the multiple first portions, the multiple second portions and the multiple third portions are arranged to form a grid structure;

the multiple first portions, the multiple second portions and the multiple third portions form lightproof areas of the black matrix; meshes of the grid structure are aperture zones of the black matrix, and the aperture zones are in one-to-one correspondence with the multiple pixel units;

a vertical projection of each of the multiple scanning lines and the vertical projection of each of the multiple data lines on the second substrate are located in the lightproof areas of the black matrix; and a minimum width of each of the multiple first portions is X, a minimum width of each of the multiple second portions is Y, and $|X-Y| \leq 2$ μm.

In a second aspect, the embodiments of the present disclosure provide a 3D printing device including the display panel provided by any one of embodiments of the present disclosure.

By setting the minimum width of the first portions to be X, setting the minimum width of the second portions to be Y, and setting $|X-Y| \leq 2$ μm, the embodiments of the present disclosure solve problems that, due to the unreasonable configuration of the existing display panel, the 3D printed product formed by using the existing display panel has undesirable pits and the quality of the 3D printing product is poor, and is capable of avoiding undesirable pits on 3D printed products, improving the quality of 3D printed products and improving the user's experience.

DETAILED DESCRIPTION

Figure 1:
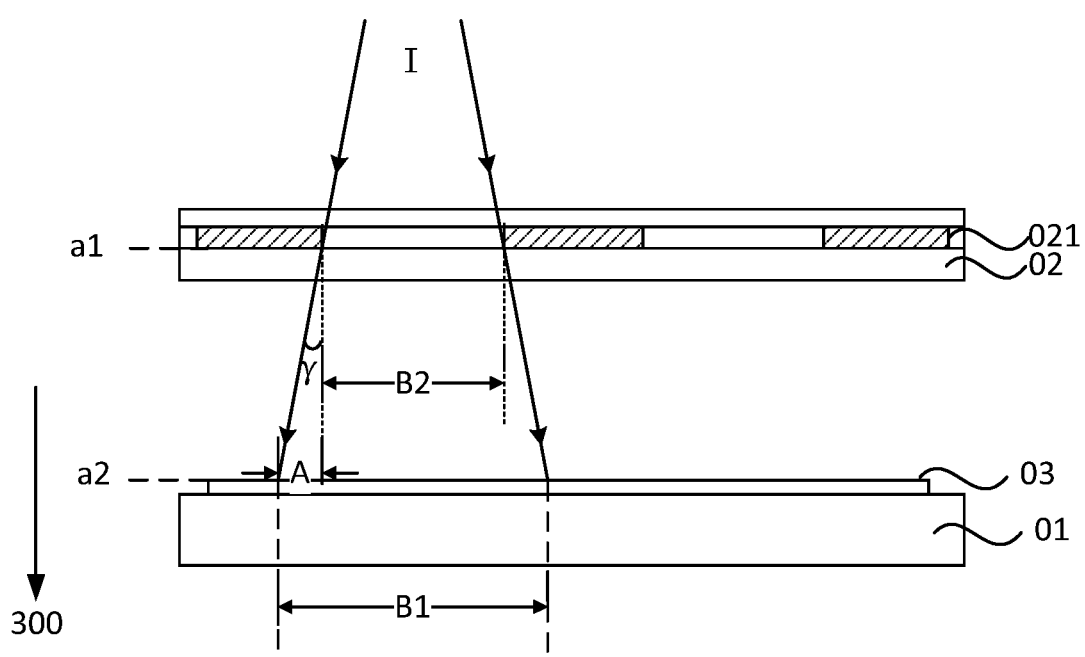
FIG. 1 is a schematic diagram illustrating 3D printing in the related art.

Hereinafter the present disclosure will be further described in detail in conjunction with the drawings and embodiments. It may be understood that the specific embodiments set forth below are intended to illustrate and not to limit the present disclosure. Additionally, it is to be noted that, for ease of description, only part, not all, of the structures related to the present disclosure are illustrated in the drawings.

As mentioned in the background, in the related art, the display panel is used as a photomask, and the quality of the 3D printed product manufactured by using the conventional display panel is poor, and thus users' requirements cannot be met. The poor quality of the 3D printed product is the inconsistent curing effect of the resin in different positions in the area corresponding to the black matrix lightproof area.

Figure 2:
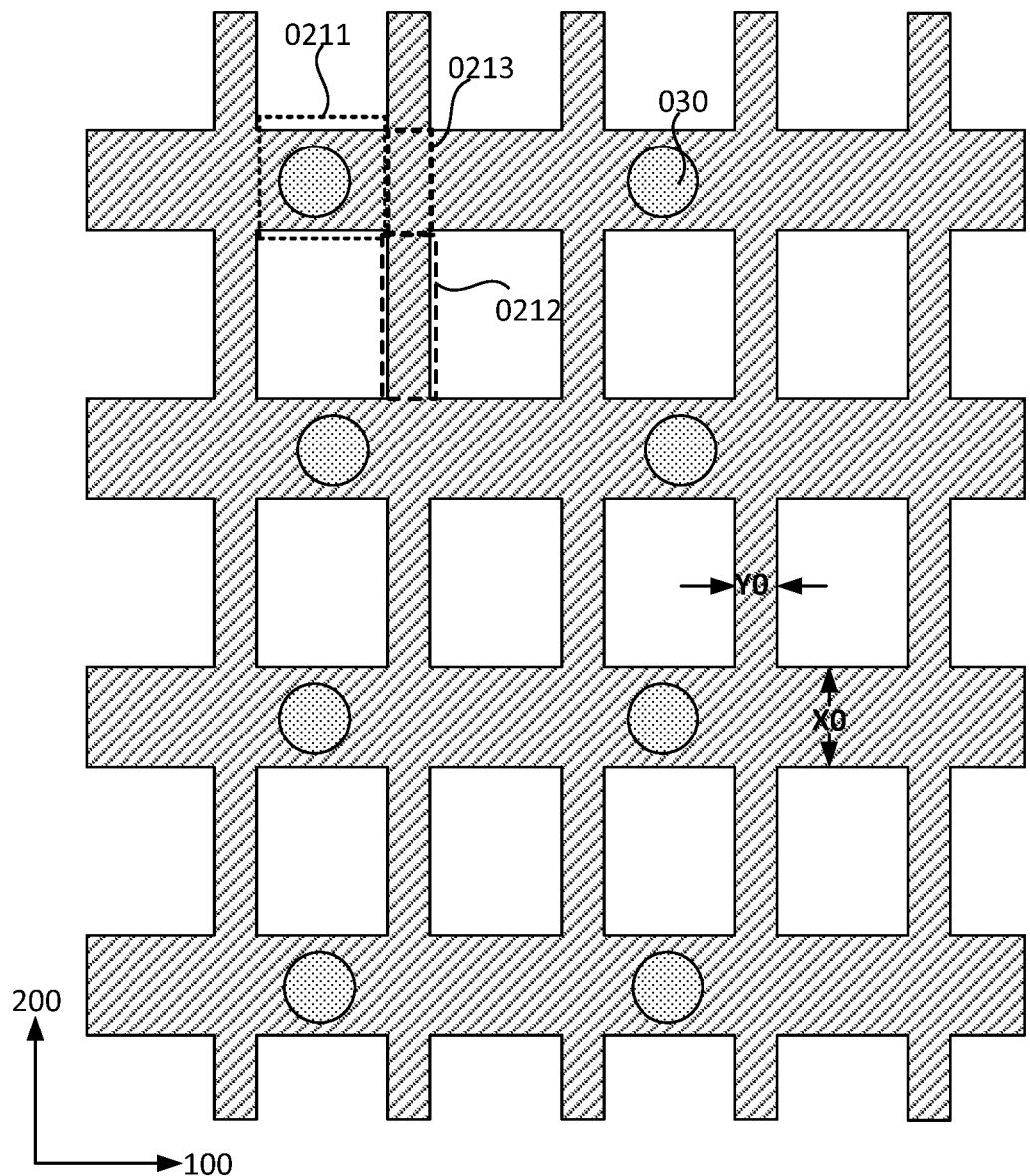
FIG. 2 is a structural diagram illustrating a black matrix in a display panel used for implementing the 3D printing in FIG. 1.

FIG. 1 is a schematic diagram illustrating 3D printing process in the related art. FIG. 2 is a structural diagram illustrating a black matrix in a display panel used for implementing the 3D printing in FIG. 1. With reference to FIGS. 1 and 2, resin 03 is coated on a pallet 01 in advance before the 3D printing, and a display panel 02 having a black matrix 021 is used as a photomask so that the ultraviolet light I is controlled to pass through the transparent areas of display panel 02 and projected on the resin 03 to cure the resin 03. The black matrix 021 includes multiple first portions 0211, multiple second portions 0212 and multiple third portions 0213. In a first direction 100, multiple first portions 0211 and multiple second portions 0212 are alternatively arranged. In a second direction 200, multiple second portions 0212 and multiple third portions 0213 are alternatively arranged. The multiple first portions 0211, the multiple second portions 0212 and the multiple third portions 0213 are arranged to form a grid structure. Meshes of the grid structure are aperture zones of the black matrix 021. The multiple first portions 0211, the multiple second portions 0212 and the multiple third portions 0213 form lightproof areas of the black matrix 021. During the 3D printing, the ultraviolet light I passes through the aperture zones of the black matrix 021 and enters the resin 03. In FIG. 2, the display panel further includes multiple supporting columns 030 in a direction 300 (FIG. 1) perpendicular to the display panel to maintain a fixed distance between two substrates in the display panel (such as the distance between an array substrate and a substrate disposed opposite to the array substrate). Each supporting column 030 is shaded by one first portion 0211.

With continued reference to FIG. 1, in practice, the ultraviolet light I passing through the edge of the aperture zone of the black matrix 021 does not propagate in the direction 300 perpendicular to the display panel, but defocused at a certain angle γ with respect to the direction 300 perpendicular to the display panel. Therefore, the size B1 of a light spot formed by the ultraviolet light I on the resin 03 is larger than the size B2 of the aperture zone through which the ultraviolet light I passes. In other words, the light spot formed by the ultraviolet light I on the resin 03 is expanded to a certain extent with respect to the aperture zone of the black matrix 021. A first surface a1 of the black matrix 021 faces down toward the resin 03, and an upper second surface a2 of the resin 03 faces away from the pallet 01. The expanded size A of the light spot formed by the ultraviolet light I on the resin 03 is related to factors such as thickness of each film layer between the first surface a1 and the second surface a2 as well as a refractive index of each film layer between the first surface a1 and the second surface a2, a relative positional relationship of an ultraviolet light source, the display panel 02 and the resin 03, and the angle γ between a propagation direction of the ultraviolet light I and the direction 300 perpendicular to the display panel. For the same display panel, if the relative positional relationship of the ultraviolet light source and the display panel 02 and the resin 03 is constant and the angle γ is constant, the expanded size A of the light spot formed by the ultraviolet light I on the resin 03 is a constant value.

An area covered by a vertical projection of the first portion 0211 of the black matrix 021 on the pallet 01 is an area corresponding to the first portion 0211 of the black matrix, that is, a first area. An area covered by a vertical projection of the second portion 0212 of the black matrix 021 on the pallet 01 is an area corresponding to the second portion 0212 of the black matrix, that is, a second area. With continued reference to FIG. 2, in the black matrix 021, a width X0 of the first portion 0211 is much larger than a width Y0 of the second portion 0212, so that a width of the first area is much larger than a width of the second area. When the expanded size A of the light spot formed by the ultraviolet light I on the resin 03 is the constant value, if X0>2A and Y0≤2A, the light spot formed by the ultraviolet light passing through two adjacent aperture zones spaced apart by the first portion 0211 may not completely cover the first area corresponding to the first portion 0211, and the light spot formed by the ultraviolet light passing through two adjacent aperture zones spaced apart by the second portion 0212 may completely cover the second area corresponding to the second portion 0212. As a result, the curing effect of the resin to be cured located in the first area is poorer because part of the resin may not be covered by the light spot; while the curing effect of the resin to be cured located in the second area may be better. Therefore, the curing effect of the resin in the first area is inconsistent with the curing effect of the resin in the second area. Since part of the resin to be cured in the first area may not be covered by the light spot, undesirable pits will occur on the 3D printed product, which does not meet users' requirements.

Figure 3:
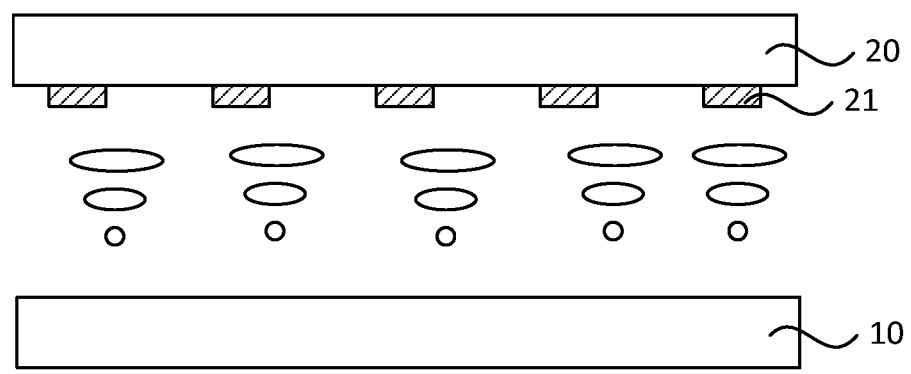
FIG. 3 is a cross sectional view of a display panel according to an embodiment of the present disclosure.
Figure 4:
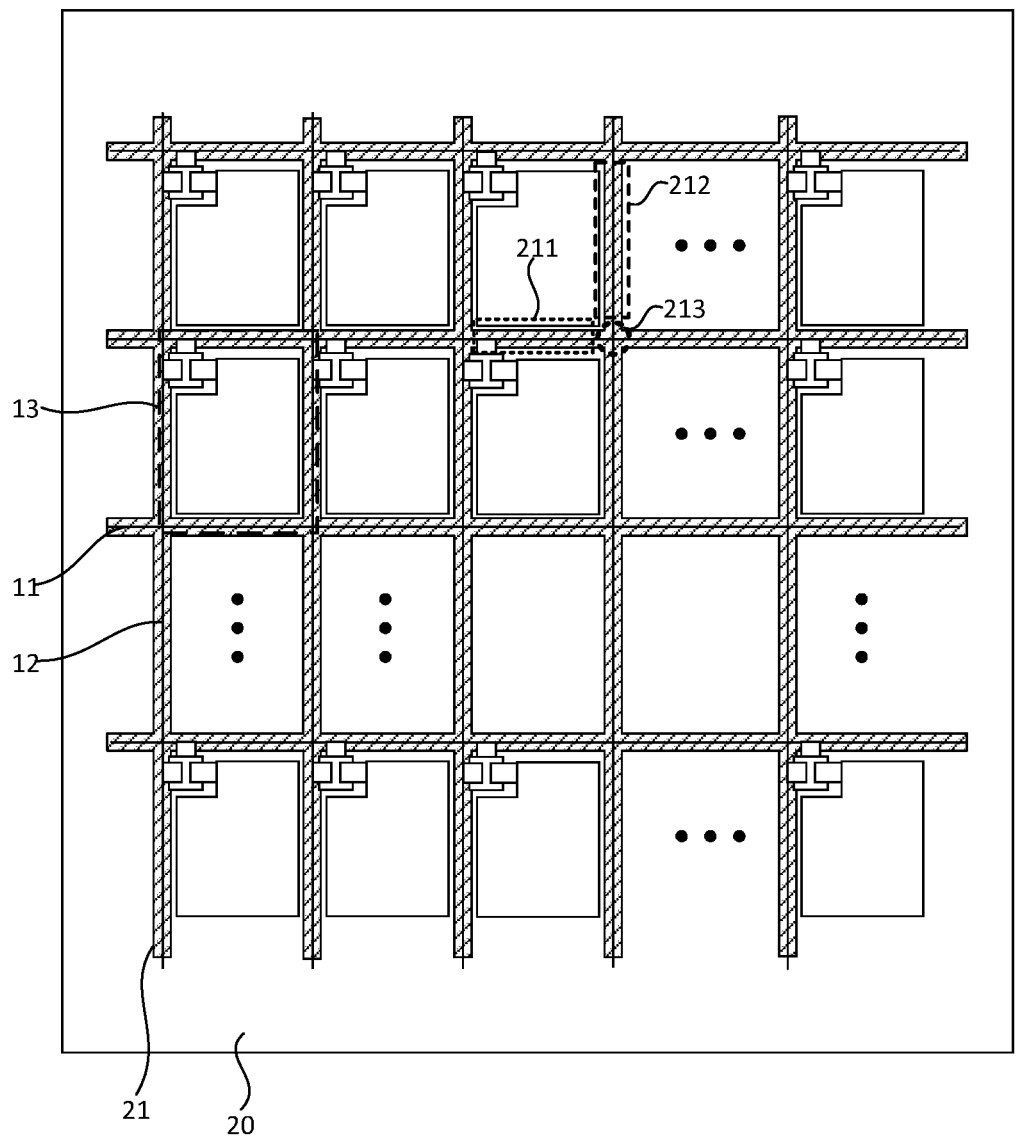
FIG. 4 is a top view of the display panel in FIG. 3, observed in a direction from a first substrate to a second substrate, with the first substrate removed.
Figure 5:
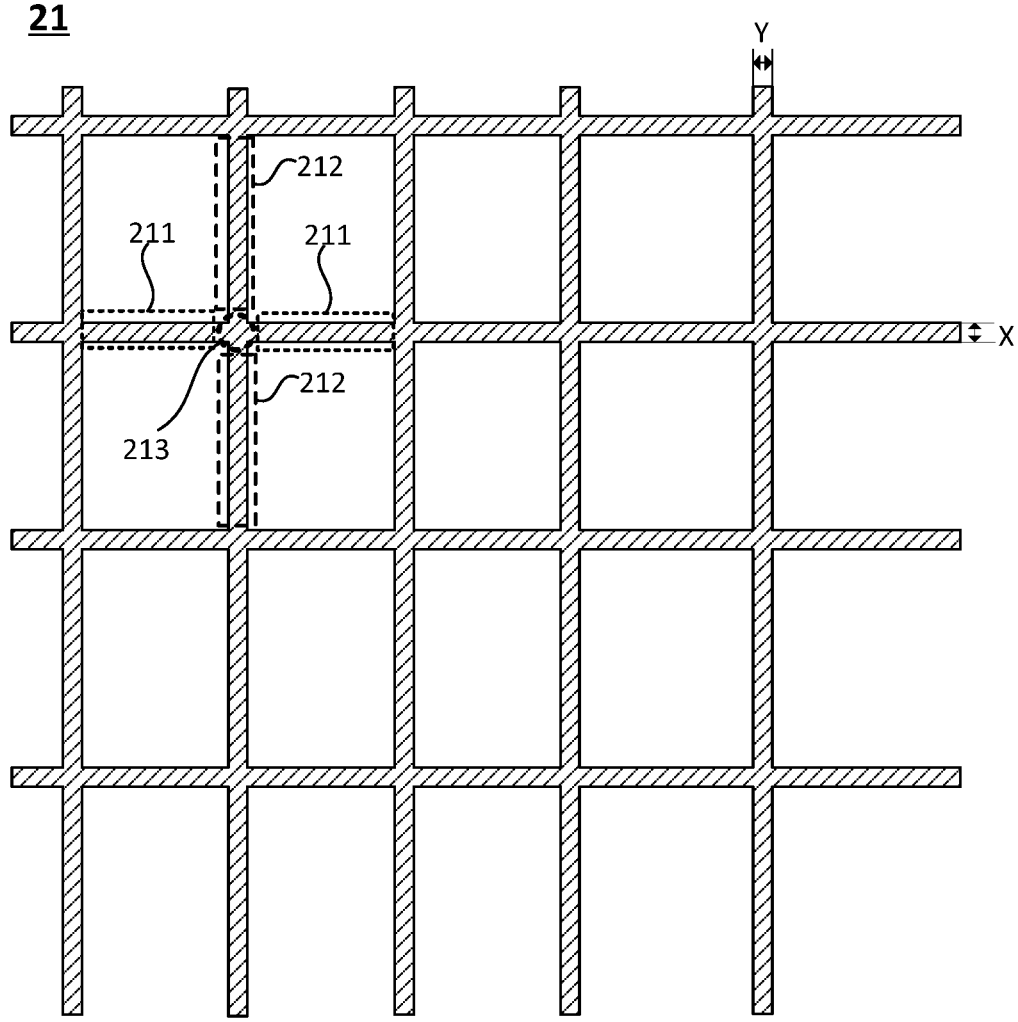
FIG. 5 is a top view of the black matrix shown in FIG. 3.

In view of the above, an embodiment of the present disclosure provides a display panel. FIG. 3 is a cross sectional view of a display panel according to an embodiment of the present disclosure. FIG. 4 is a top view of the display panel in FIG. 3, observed in a direction from a first substrate to a second substrate, with the first substrate removed. FIG. 5 is a structural diagram illustrating the black matrix in FIG. 3 With reference to FIGS. 3-5, the display panel includes a first substrate 10 and a second substrate 20 disposed opposite to the first substrate 10. Multiple scanning lines 11 and multiple data lines 12 are formed on the first substrate 10. The multiple scanning lines 11 and the multiple data lines 12 are insulated from each other and intersect to define multiple pixel units 13. A black matrix 21 is formed on the second substrate 20. The black matrix 21 includes multiple first portions 211, multiple second portions 212 and multiple third portions 213. The multiple first portions 211 and the multiple third portions 213 are alternately arranged in a direction in which the multiple scanning lines 11 extend. The multiple second portions 212 and the multiple third portions 213 are alternately arranged in a direction in which the multiple data lines 12 extend. The multiple first portions 211, the multiple second portions 212 and the multiple third portions 213 are arranged to form a grid structure. Meshes of the grid structure are aperture zones of the black matrix 21. The multiple first portions 211, the multiple second portions 212 and the multiple third portions 213 form lightproof areas of the black matrix 21. The aperture zones are in one-to-one correspondence with the multiple pixel units 13. The vertical projection of each scanning line 11 and the vertical projection of each data line 12 on the second substrate 20 are located in the lightproof areas. The minimum width of each first portion 211 is X, and the minimum width of each second portion 212 is Y, where $|X-Y|\leq 2$ μm.

An area covered by a vertical projection of each first portion 211 of the black matrix 21 on a pallet is an area corresponding to the first portion 211 of the black matrix, that is, a first area. An area covered by a vertical projection of each second portion 212 of the black matrix 21 on the pallet is an area corresponding to the second portion 211 of the black matrix, that is, a second area. By setting $|X-Y|\leq 2$ μm, the width X of each first portion 211 is equal to or approximately equal to the width Y of each second portion 212, so that the width of the first area is equal to or approximately equal to the width of the second area. When the expanded size of the light spot formed by the ultraviolet light on the resin is a constant value, the situation about how the first area corresponding to the first portion 211 is covered by the light spot, formed by the ultraviolet light passing through two adjacent aperture zones spaced apart by the first portion 211, is the same as or approximately same as the situation about how the second area corresponding to the second portion 212 is covered by the light spot, formed by the ultraviolet light passing through two adjacent aperture zones spaced apart by the second portion 212. Therefore, the curing effect of the resin in the first area is consistent with or approximately consistent with the curing effect of the resin in the second area to avoid undesirable pits on 3D printed products, thereby improving the quality of 3D printed products and improving the user's experience.

Optionally, X is equal to Y. Such configuration makes the width of the first area be equal to the width of the second area, and further make the curing effect of the resin to be cured at different positions in the areas corresponding to the black matrix lightproof areas consistent, with each other, thereby avoiding undesirable pits on 3D printed products and improving the quality of 3D printed products.

It is to be noted that, in the related art, the term "aperture zone" generally refers to the aperture zone of the display panel, and specifically refers to an area of the pixel unit where light is allowed to pass through after a wiring portion (including scanning lines and data lines, etc.), a thin film transistor and other components are removed from the pixel unit. In the present application, the term "aperture zone" refers to the aperture zone of the black matrix, and specifically refers to meshes of the black matrix 21 of the grid structure, which are surrounded by the first portion 211, the second portion 212 and the third portion 213. In practice, the wiring portion is generally hid by the black matrix 21. The thin film transistor may be or may be not hid by the black matrix 21. Therefore, the area of the aperture zone of the black matrix in the present application may be equal to the area of the aperture zone of the display panel in the related art, or may not be equal to the area of the aperture zone of the display panel in the related art. The area of the aperture zone of the black matrix is not limited in the present application. In the present application, the term "aperture zone" refers to the aperture zone of the black matrix.

There are multiple solutions to implement $|X-Y|\leq 2$ μm. Based on that the width of the first portion is greater than the width of the second portion in the related art, during the setting, $|X-Y|\leq 2$ μm may be implemented by widening the width of the second portion or narrowing the width of the first portion.

Although the curing effect of the resin in the first area may be consistent with or approximately consistent with the curing effect of the resin in the second area by widening the width of the second portion, other problems may occur if the configuration is not proper. Specifically, the light passes through the display panel to form a light spot on a plane where a surface, close to the resin to be printed, of the display panel is located, which is referred to as an intermediate light spot, and form a light spot on the resin to be printed, which is referred to as a printing light spot. Since the light from an optical source for printing is not propagated in a direction completely perpendicular to the display panel, the intermediate light spot is different from the printing light spot, and the area of the printing light spot is larger than the area of the intermediate light spot. Since the display panel is provided with the black matrix, adjacent intermediate light spots are separate from each other and are not overlapped with each other, while adjacent printing light spots may be overlapped with each other due to larger area of the printing light spot. However, the width of the first portion and the second portion is large, and in premises that the light intensity of the optical source for printing is fixed and the direction of light propagation is fixed, in order to maintain the intensity of the light, the distance between the display panel and the resin to be printed needs to be set small. At this moment, the expanded size of the printing light spot is small with respect to the intermediate light spot, which may not enable the adjacent printing light spots to overlap with each other, thereby resulting in pits on the printed product. On the other hand, if the distance between the display panel and the resin to be printed is increased to avoid the occurrence of pits on the printed product, the light intensity for the printing light spot is decreased, the speed of resin curing is slowed, the printing time becomes long, and the printing efficiency is reduced.

On the basis of the solution of narrowing the width of the first portion, several typical examples are given below, but not intended to limit the present disclosure.

Figure 6:
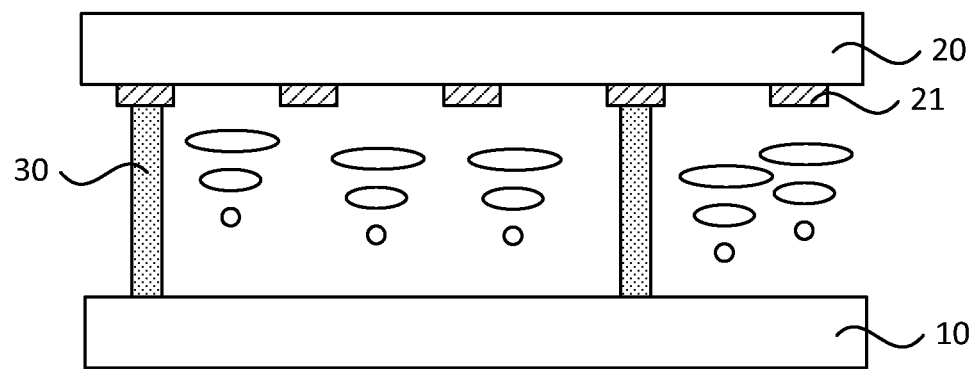
FIG. 6 is a cross sectional view of another display panel according to an embodiment of the present disclosure.
Figure 7:
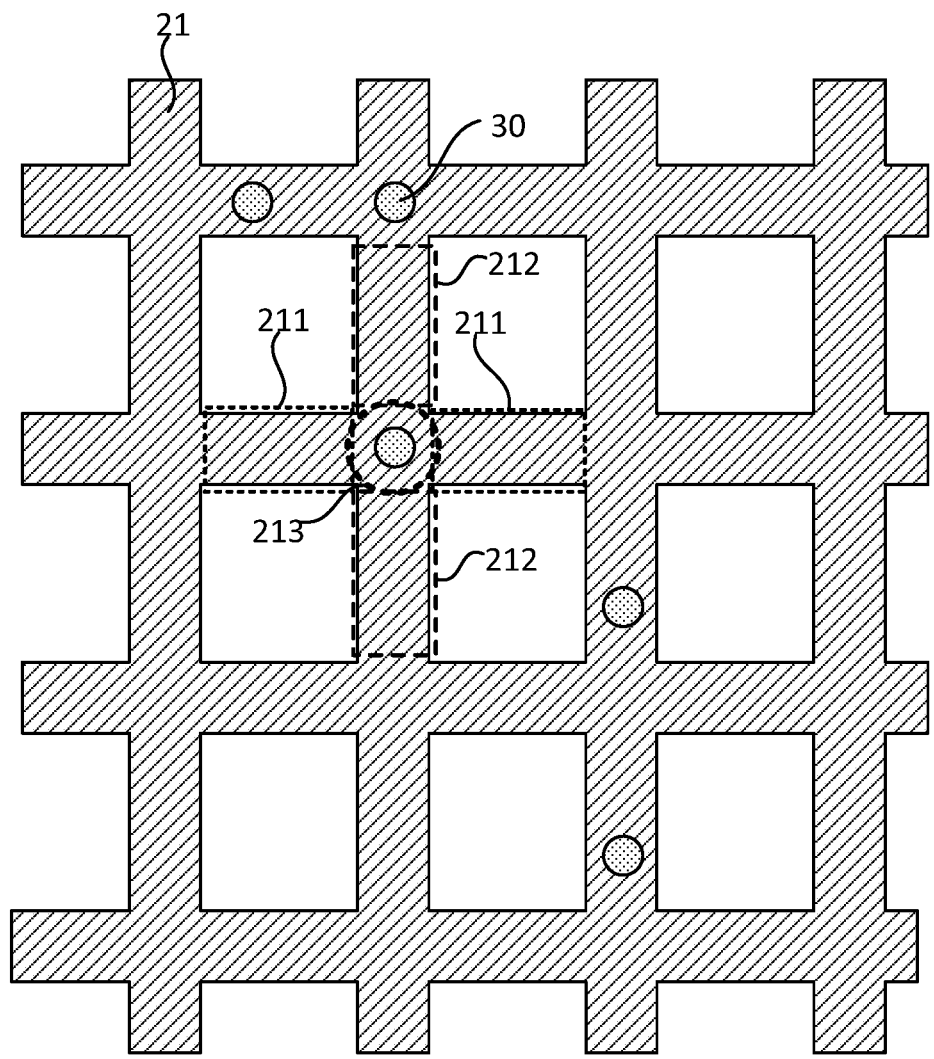
FIG. 7 is a top view of a black matrix and supporting columns according to an embodiment of the present disclosure.

FIG. 6 is a cross sectional view of another display panel according to an embodiment of the present disclosure. FIG. 7 is a top view of a black matrix and supporting columns according to an embodiment of the present disclosure. With reference to FIGS. 6 and 7, the display panel further includes multiple supporting columns 30. The multiple supporting columns 30 are located between the first substrate 10 and the second substrate 20. A vertical projection of the supporting column 30 on the second substrate 20 is located in at least one of the following positions: the vertical projection of the first portion 211 on the second substrate 20, the vertical projection of the second portion 212 on the second substrate 20, and the vertical projection of the third portion 213 on the second substrate 20. The supporting column 30 is mainly configured to maintain the distance between the first substrate 10 and the second substrate 20, so as to maintain the stability of the display panel. Since the supporting column 30 is lightproof, the transmission of the ultraviolet light will be blocked. If the supporting column 30 is disposed in the aperture zone of the black matrix 21, the area of a region in the aperture zone, where the ultraviolet light is allowed to transmit, is reduced, thereby reducing the transmittance of the ultraviolet light. Since lightproof areas of the black matrix 21 (including the first portion 211, the second portion 212 and the third portion 213) are lightproof, the probability that the supporting column 30 blocks the ultraviolet light may be reduced by arranging the vertical projection of the supporting column 30 on the second substrate 20 to be located in at least one of the following positions: the vertical projection of the first portion 211 on the second substrate 20, the vertical projection of the second portion 212 on the second substrate 20, and the vertical projection of the third portion 213 on the second substrate 20. As a result, the area of the region in the aperture zone where the ultraviolet light is allowed to transmit may be increased, and the transmittance of the ultraviolet light may be improved.

Figure 8:
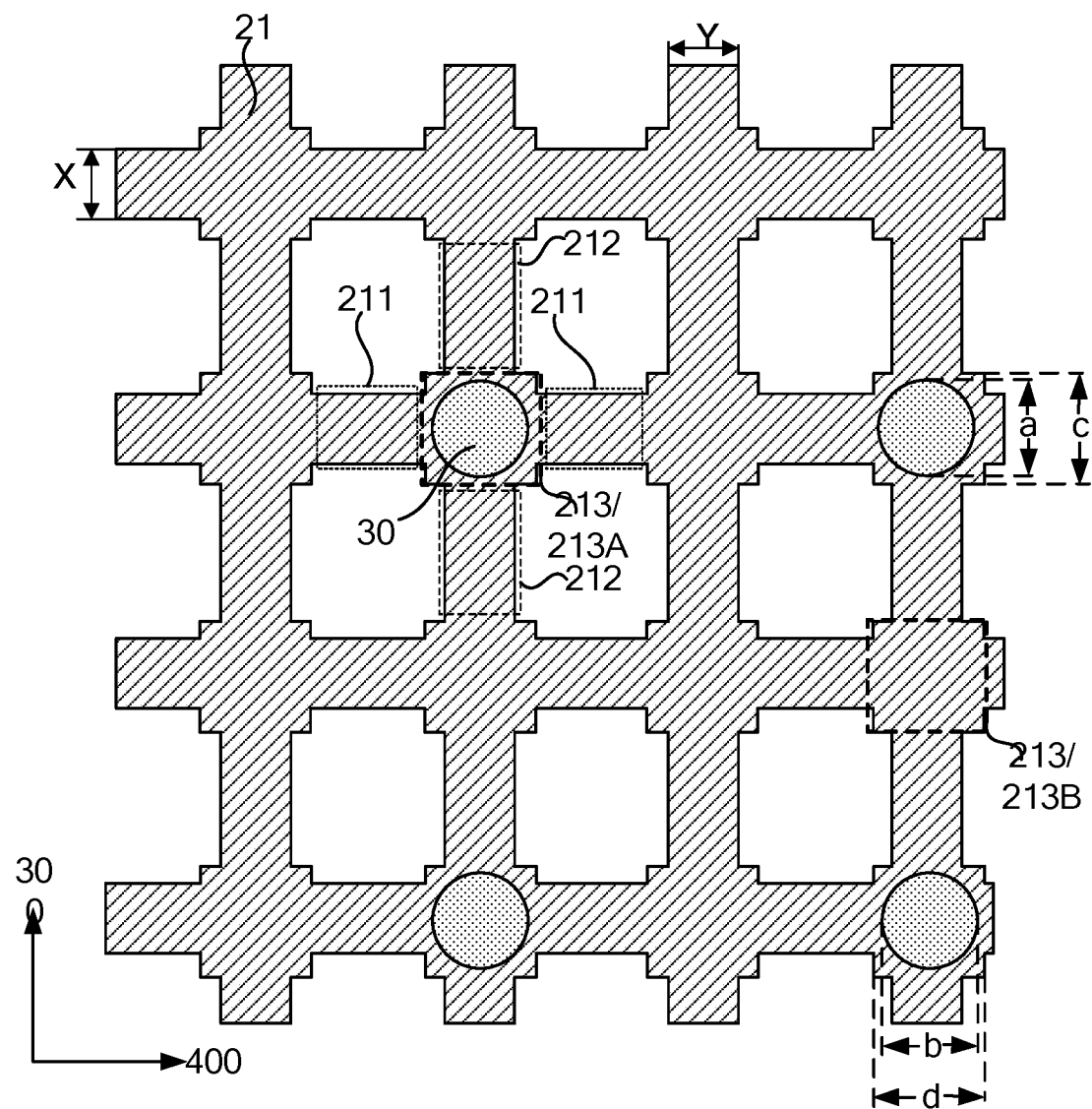
FIG. 8 is a top view of another black matrix and supporting columns according to an embodiment of the present disclosure.

FIG. 8 is a top view of another black matrix and supporting columns according to an embodiment of the present disclosure. With reference to FIG. 8, in the direction 300 in which the multiple data lines extend, the width of the vertical projection of the supporting column 30 on the second substrate is a, and in the direction 400 in which the multiple scanning lines extend, the width of the vertical projection of the supporting column 30 on the second substrate is b. The vertical projection of the supporting column 30 on the second substrate is located within the vertical projection of the third portion 213 on the second substrate when the followings are met: a>X; and/or, b>Y; in the direction 300 in which the multiple data lines extend, the maximum width of the vertical projection of the third portion 213 on the second substrate is c; and in the direction 400 in which multiple scanning lines extend, the maximum width of the vertical projection of the third portion 213 on the second substrate is d, where c>a and d>b.

If the supporting column 30 is arranged so that the vertical projection thereof on the second substrate is located in the vertical projection of the first portion 211 on the second substrate when a>X, part of the vertical projection of the supporting column 30 on the second substrate is located in the aperture zone. As a result, the area of the region in the aperture zone disposed around the supporting column 30, where the ultraviolet light is allowed to transmit, is reduced, and thus the transmittance of the ultraviolet light is reduced. Similarly, if the supporting column 30 is arranged so that the vertical projection thereof on the second substrate is located in the vertical projection of the second portion 212 on the second substrate when b>Y, the area of the region in the aperture zone disposed around the supporting column 30, where the ultraviolet light is allowed to transmit, is reduced, and thus the transmittance of the ultraviolet light is reduced. By setting c>a, d>b and arranging the supporting column 30 so that the vertical projection of the supporting column 30 on the second substrate is located in the vertical projection of the third portion 213 on the second substrate, the area of the region in the aperture zone disposed around the supporting column 30, where the ultraviolet light is allowed to transmit, is not reduced, thereby maintaining high transmittance of the ultraviolet light.

In addition, on the basis of above technical solutions, the supporting columns 30 are arranged so that the vertical projection of each supporting column 30 on the second substrate 20 is located in the vertical projections of the multiple third portions 213 on the second substrate 20. In this way, it is undesirable to shade and hide the multiple supporting columns 30 with the multiple first portions 211 and the multiple second portions 212. Therefore, the width of each first portion 211 and the width of each second portion 212 may be reduced as much as possible, so as to increase the area of a single aperture zone of the black matrix and increase the transmittance of the ultraviolet light.

In addition, with reference to FIG. 8, the black matrix 21 includes two kinds of third portion 213, that is, the third portion 213A and the third portion 213B. The third portion 213A is provided with the supporting column 30, and the supporting column 30 is shaded by the third portion 213A. The third portion 213B is not provided with the supporting column 30. However, the shape and the size of the third portion 213B and the third portion 213A are set to be the same or approximately the same. The purpose of such configuration is to make the shape and the size of each aperture zone of the black matrix the same or approximately the same, so that the ultraviolet light forms light spots of the same shape and size after passing through different pixel units and the display panel obtains a good printing effect.

In the above technical solutions, optionally, each third portion 213 is an axisymmetric shape including at least one axis of symmetry. The at least one axis of symmetry is parallel to the multiple data lines 12, and/or the at least one axis of symmetry is parallel to the multiple scanning lines. In this way, the shape and the area of each aperture zone disposed adjacently in the black matrix 21 are the same, thereby reducing the influence of difference in the shape and size of each aperture zone on the curing effect of the resin in the 3D printing process, and improving the quality of the 3D printed product.

Optionally, $|c-d|≤5$ µm. This configuration may further make the shape and the size of each aperture zone of the black matrix disposed adjacently in the black matrix 21 the same, so as to improve the quality of the 3D printed product.

In the above technical solutions, optionally, the shape of the third portion 213 is a circle, an ellipse or a regular polygon and the like. Exemplarily, in FIG. 8, the shape of the third portion 213 is a regular polygon.

In the display panel, each pixel unit includes a thin film transistor. During the 3D printing, the working state of each pixel unit is controlled by controlling the thin film transistor to be turned on or turned off. Since the active layer of the thin film transistor is sensitive to the irradiation of the ultraviolet light, light leakage current occurs in the thin film transistor if the ultraviolet light illuminates the active layer of the thin film transistor, thereby affecting the electrical properties of the thin film transistor, which undoubtedly affects the quality of the 3D printed product. In practice, in order to ensure that the 3D printed product has good quality, this factor needs to be considered.

Figure 9:
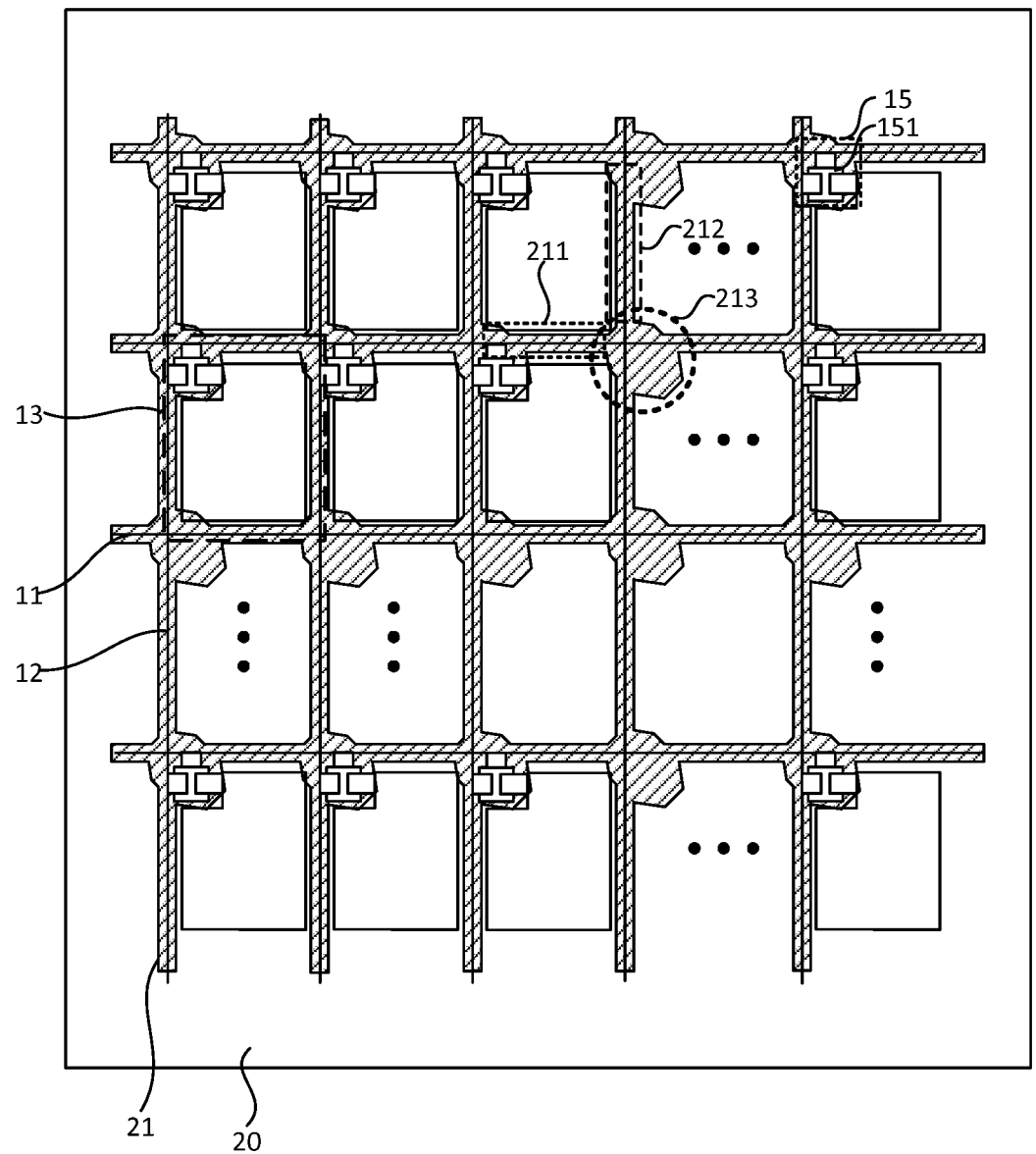
FIG. 9 is a top view of another display panel according to an embodiment of the present disclosure with the first substrate removed.

FIG. 9 is a top view of another display panel according to an embodiment of the present disclosure with the first substrate removed. With reference to FIG. 9, in the display panel, on the first substrate, each pixel unit 13 includes a thin film transistor 15. The thin film transistor 15 includes an active layer 151. The vertical projection of the active layer 151 on the second substrate 20 is located in vertical projection of the third portion 213 on the second substrate 20. Through such configuration, the active layer 151 of the thin film transistor 15 is shaded by the third portion 213, so as to prevent the electrical properties of the thin film transistor 15 from being affected, thereby improving the quality of the 3D printed product. It is to be noted that the technical solution provided in FIG. 9 is applicable in a solution with amorphous silicon as the active layer.

Since the light transmittance of the active layer 151 is poor, compared with the solution in which the active layer 151 is disposed in the aperture zone of the black matrix 21, the active layer 151 is arranged so that the vertical projection thereof on the second substrate 20 is located in vertical projection of the third portion 213 on the second substrate 20. In this way, the probability that the active layer 151 blocks the ultraviolet light may be reduced, the area of the region in the aperture zone of the black matrix, where the ultraviolet light is allowed to be transmitted, may be increased, and the transmittance of the ultraviolet light is improved.

Furthermore, in the existing display panel, the materials used to manufacture the active layer are mostly amorphous silicon, low temperature polysilicon or metal oxide (such as indium gallium zinc oxide, IZGO), and this factor is considered. Since the electron mobility of low temperature polysilicon or metal oxide is much higher than the electron mobility of amorphous silicon, when the amorphous silicon is used for manufacturing the active layer, the area of the active layer needs to be set large, and when the low temperature polysilicon or the metal oxide is used for manufacturing the active layer, the area of the active layer may be set small.

Figure 10:
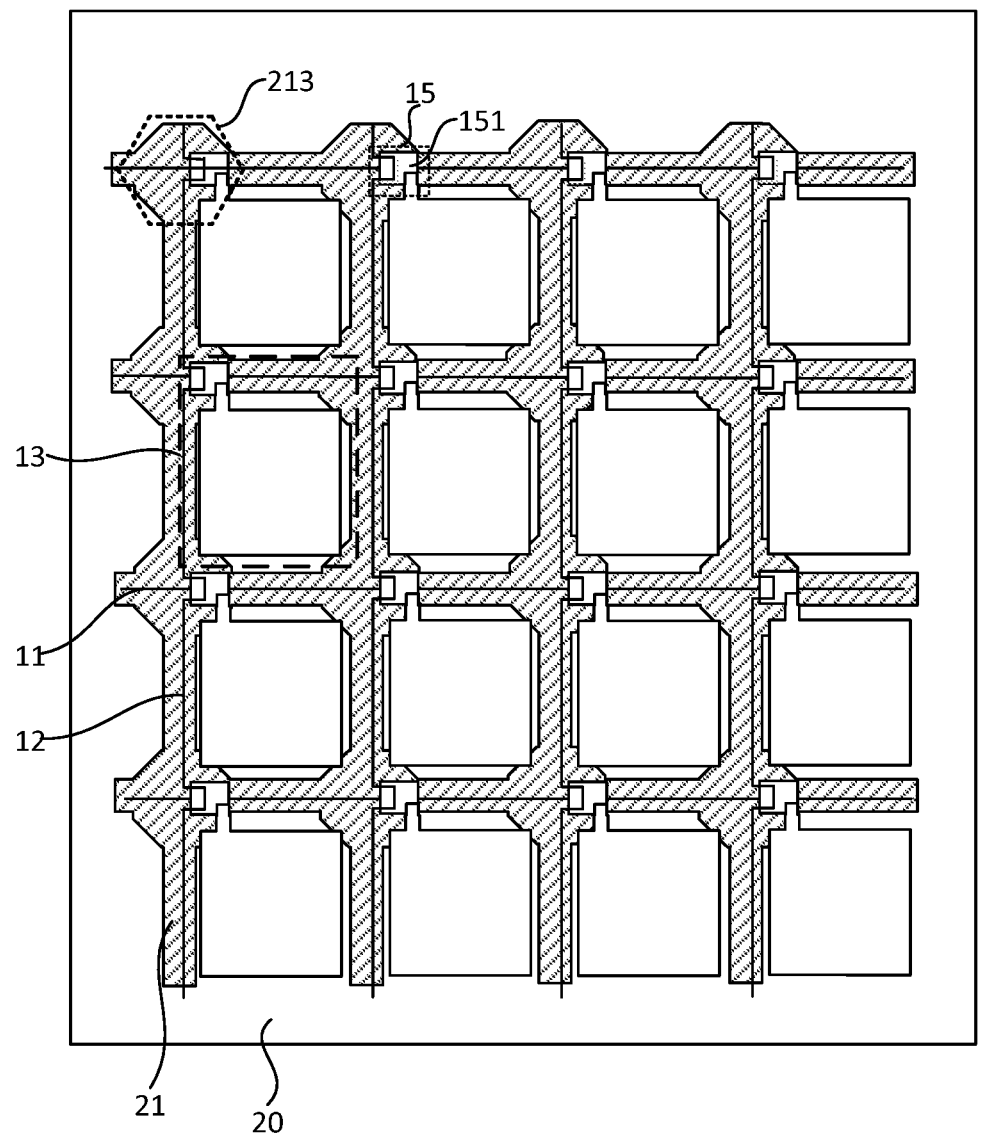
FIG. 10 is a top view of another display panel with the first substrate removed according to an embodiment of the present disclosure.

FIG. 10 is a top view of another display panel according to an embodiment of the present disclosure with the first substrate removed. The technical solution provided in FIG. 10 is also applicable in a solution with amorphous silicon served as the active layer. Comparing FIG. 9 with FIG. 10, in FIG. 9, a protruding portion of the scanning line 11 is used as a gate, while in FIG. 10, instead of separately manufacturing a gate of the thin film transistor 15, the arrangement position of the active layer 151 is changed so that the vertical projection of the active layer 151 of each pixel unit 13 on the second substrate 20 at least partially coincides with the vertical projection of the scanning line 11 electrically connected to the pixel unit 13 on the second substrate 20. In this way, in FIG. 10, a portion in the scanning line 11, whose vertical projection overlaps with the vertical projection of the active layer 151, is used as the gate of the thin film transistor 15, thereby sufficiently reducing the distance between the scanning line 11 and the active layer 151 in the direction of the data line 12, reducing the size of the third portion 213 for shading the active layer 151, increasing the area of the region in the aperture zone of the black matrix where the ultraviolet light is allowed to transit, and improving the transmittance of the ultraviolet light.

In addition, with continued reference to FIG. 10, the data line 12 is not separately served as a signal input terminal of the thin film transistor 15 (in FIG. 9, a protruding portion of the data line is used as the signal input terminal), while the arrangement position of the active layer 151 is changed so that the vertical projection of the active layer 151 of each pixel unit 13 on the second substrate 20 at least partially coincides with the vertical projection of the data line 12 electrically connected to the pixel unit 13 on the second substrate 20. In this way, a portion in the data line 12, whose vertical projection overlaps with the vertical projection of the active layer 151, is used as the signal input terminal of the thin film transistor 15, which may also sufficiently reduce the distance between the data line 12 and the active layer 151 in the direction of the scanning line 11, thereby reducing the size of the third portion 213 for shading the active layer 151, increasing the area of the region the aperture zone of the black matrix where the ultraviolet light is allowed to transit, and improving the transmittance of the ultraviolet light.

Optionally, with continued reference to FIG. 10, the portion in the data line 12, whose vertical projection overlaps with the vertical projection of the active layer 151, is in the shape of a zigzag line. Such configuration may increase the area where the portion of the data line 12 served as the signal input terminal overlaps with the vertical projection of the active layer 151, and improve the driving ability of the thin film transistor 15.

Figure 11:
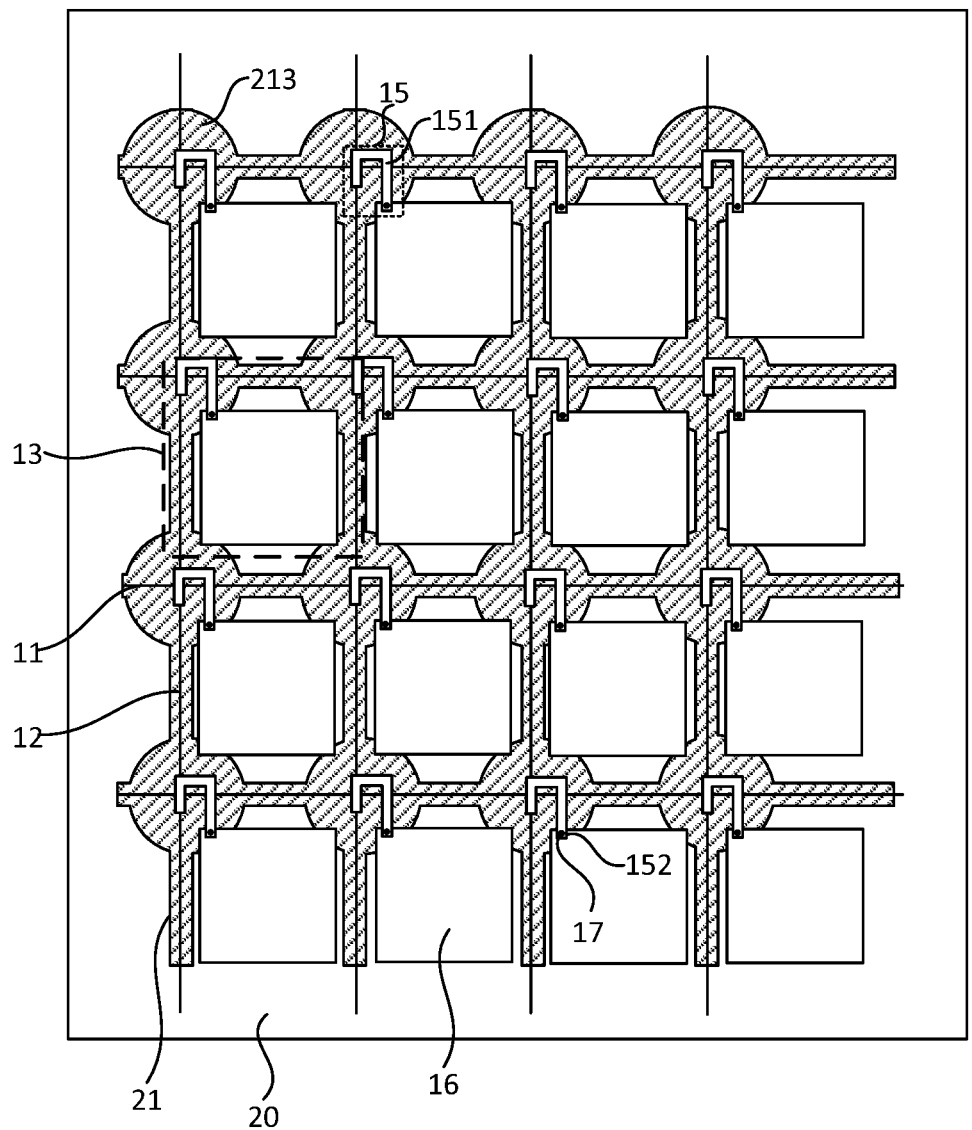
FIG. 11 is a top view of another display panel with the first substrate removed.

FIG. 11 is a top view of another display panel according to an embodiment of the present disclosure with the first substrate removed. The technical solution provided in FIG. 11 is also applicable in a solution in which low temperature polysilicon or metal oxide is served as the active layer. With reference to FIG. 11, in the display panel, the active layer 151 of the thin film transistor 15 is configured to be a U shape, and two sidewalls of the U shape are respectively effective channel areas of the active layer 151, thereby reducing the leakage current of the thin film transistor 15. The effective channel areas of the active layer 151 refer to a portion where the active layer overlaps with the scanning line 11. The leakage current of the thin film transistor 15 may be further reduced by configuring the active layer 151 to be the U shape, and the driving ability of the thin film transistor 15 is improved by increasing the length of the effective channel areas of the active layer 151 of the thin film transistor 15.

It is to be noted that, since the active layers made of different materials have different electron mobility, areas of the active layers made of different materials need to be set differently in practice. Optionally, the third portion is adjusted according to the area of the active layer which the third portion needs to shade, so as to increase the area of the black matrix aperture zone as much as possible.

With continued reference to FIG. 11, on the first substrate (not shown in FIG. 11), each pixel unit 13 further includes a pixel electrode 16. The thin film transistor further includes a signal output terminal 152. The pixel electrode 16 and the signal output terminal 152 are connected through a via hole 17. The vertical projection of the via hole 17 on the second substrate is located in vertical projection of the third portion 213 on the second substrate 20. Since the light transmittance of the via hole 17 is poor, by arranging the via hole 17 so that the vertical projection thereof on the second substrate 20 is located in vertical projection of the third portion 213 on the second substrate 20, the probability that the via hole 17 blocks the ultraviolet light may be reduced, the area of the region in the aperture zone where the ultraviolet light is allowed to transmit may be increased, and the transmittance of the ultraviolet light is improved.

In the embodiments shown in FIGS. 10 and 11, the position of the thin film transistor is closer to the intersection of the data line 12 and the scanning line 11, which facilitates the third portion 213 of the black matrix to be equally distributed among adjacent four pixel units 13 while shading the thin film transistor 15. That is, compared with the related art, the black matrix corresponding to one pixel unit 13 is equally distributed by four pixel units 13, which may reduce the distance between intermediate light spots corresponding to adjacent pixel units 13, so that the distance between adjacent printing light spots is zero or the adjacent printing light spots overlap with each other to avoid the occurrence of pits in the printed product.

In the case that the display panel includes both the active layer and the supporting column, if it is desired to shade the active layer 151 and the supporting column 30 by the same third portion 213 and the vertical projection of the support pillar 30 on the first substrate 10 does not coincide with the vertical projection of the active layer 151 of the thin film transistor 15 on the first substrate 10, a third portion 213 of larger size is required to simultaneously shade the supporting column 30 and the active layer 151 of the thin film transistor 15. It will undoubtedly reduce the area of the region in the aperture zone of the black matrix 21 where the ultraviolet light is allowed to transmit, and reduce the transmittance of the ultraviolet light. In the case that the vertical projection of the supporting column 30 on the first substrate 10 at least partially coincides with the vertical projection of the active layer 151 of the thin film transistor 15 on the first substrate 10, the supporting column 30 is liable to drop if the supporting column 30 is disposed on the side, facing away from the first substrate 10, of the thin film transistor 15 because the side, facing away from the first substrate 10, of the thin film transistor 15 is uneven after the thin film transistor 15 is formed. As a result, the supporting column may not better play its role in maintaining the distance between the first substrate 10 and the second substrate 20 and maintaining the stability of the display panel.

Figure 12:
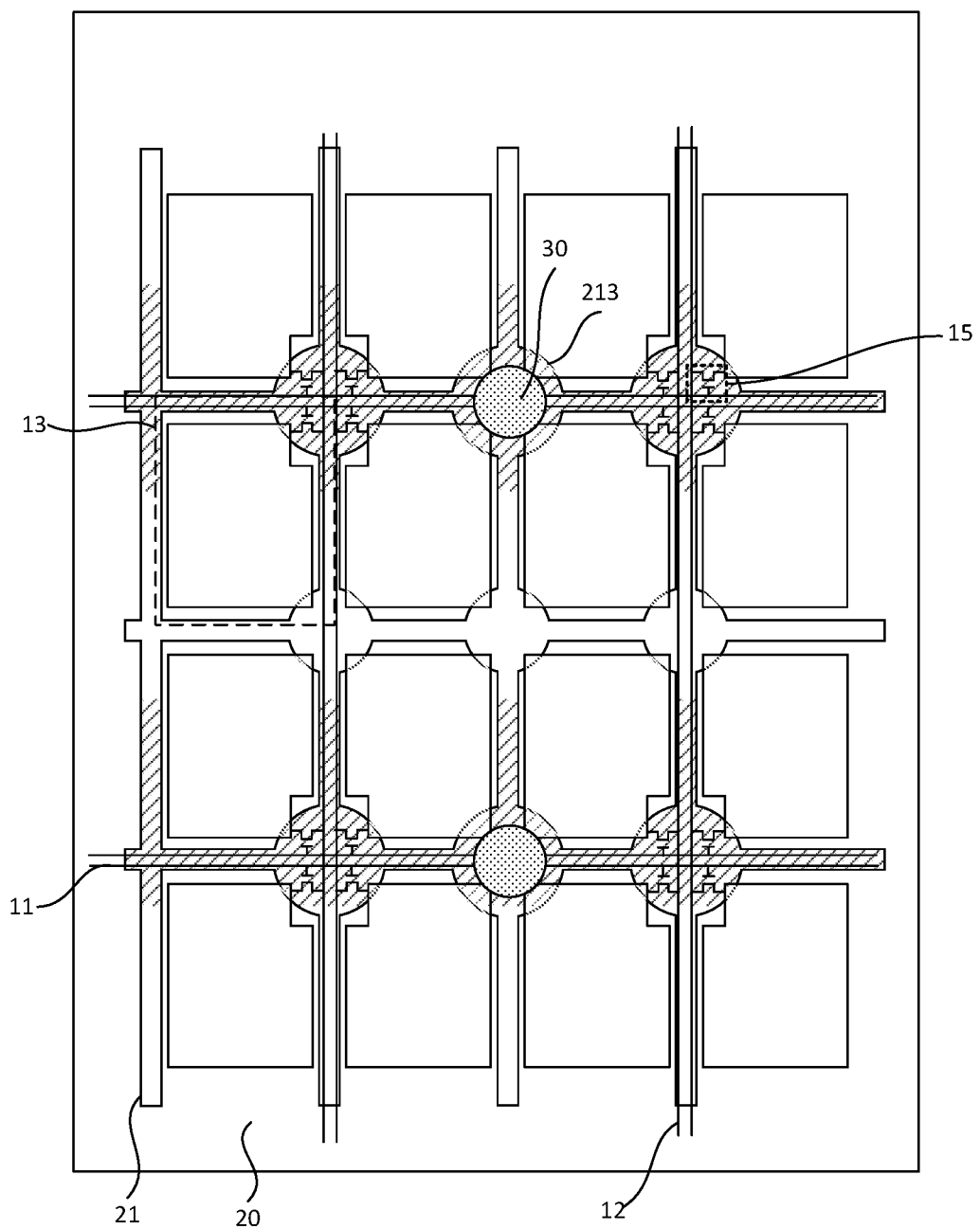
FIG. 12 is a top view of another display panel according to an embodiment of the present disclosure with the first substrate removed.

FIG. 12 is a top view of another display panel according to an embodiment of the present disclosure with the first substrate removed. With reference to FIG. 12, in the display panel, the vertical projection of the supporting column 30 on the second substrate 20 and the vertical projection of the active layer of the thin film transistor 15 on the second substrate 20 are located in vertical projections of different third portions 213 on the second substrate 20. Through such configuration, the active layer and the supporting column 30 in essence is shaded by different third portions 213. Such configuration, in one aspect, may reduce the size of the third portion 213, and in another aspect, may enable the supporting column to better play its role in maintaining the distance between the first substrate 10 and the second substrate 20 and maintaining the stability of the display panel.

With continued reference to FIG. 12, vertical projections of the active layer 151 of the thin film transistor 15 of four pixel units 13 adjacent to the same third portion 213 on the second substrate 20 are located in vertical projection of the third portion 213 on the second substrate 20. Through such configuration, thin film transistors of the four pixel units 13 adjacent to the same third portion 213 are in essence adjacently disposed, and are shaded by the same third portion 213. Such configuration may reduce the number of third portions 213 configured to shade the thin film transistors as much as possible and reserve more third portions 213 for arranging the supporting columns.

Furthermore, in FIG. 12, the size of the third portion 213 for shading the supporting column 30 and the size of the third portion for shading the active layer of the thin film transistor 15 are the same or approximately the same. Such configuration may enable the ultraviolet light to form light spots of the same shape and size after passing through different pixel units, thereby enabling the display panel to obtain a good printing effect.

In the above technical solutions, optionally, the direction in which the multiple data lines extend is perpendicular to the direction in which the multiple scanning lines extend. Such configuration may enable the ultraviolet light emitted from adjacent aperture zones in the black matrix 21 to have a good spot fusion effect on the resin to be cured. That is, the light spot formed after the ultraviolet light passes through the black matrix 21 may sufficiently cover the vertical projection of black matrix 21 on the pallet, and further improve the quality of the 3D printed product.

In addition, optionally, each data line 12 and each scanning line 11 are linear. For a display panel with the same size, the total area of linear data lines 12 and scanning lines 11 is smaller than the total area of zigzag or curved data lines 12 and scanning lines 11, thereby increasing the area of each aperture zone in the black matrix 21 and improving the transmittance of the ultraviolet light.

Based on the same concept, the present application further provides a 3D printing device including the display panel provided by any one of embodiments of the present application.

Since the 3D printing device provided by the present application includes the display panel provided by any one of embodiments of the present application, the 3D printing device has corresponding beneficial effects of the included display panel, and details about that will not be described herein.

It to be noted that the above are only preferred embodiments of the present disclosure and the technical principles used therein. It will be understood by those skilled in the art that the present disclosure is not limited to the embodiments described herein. Those skilled in the art can make various apparent modifications, adaptations, combinations and substitutions without departing from the scope of the present disclosure. Therefore, while the present disclosure has been described in detail via the above-mentioned embodiments, the present disclosure is not limited to the above-mentioned embodiments and may include more other equivalent embodiments without departing from the concept of the present disclosure. The scope of the present disclosure is determined by the scope of the appended claims.

The invention claimed is:

1. A display panel, comprising:
a first substrate, wherein multiple scanning lines and multiple data lines are formed on the first substrate, wherein the multiple scanning lines and the multiple data lines intersect insulatively to define multiple pixel units; and
a second substrate disposed opposite to the first substrate, wherein a black matrix is formed on the second substrate;
wherein multiple supporting columns are arranged between the first substrate and the second substrate;
wherein the black matrix comprises multiple first portions, multiple second portions and multiple third portions, wherein the multiple first portions and the multiple third portions are alternately arranged in a first direction in which the multiple scanning lines extend, wherein the multiple second portions and the multiple third portions are alternately arranged in a second direction in which the multiple data lines extend, and wherein the multiple first portions, the multiple second portions and the multiple third portions are arranged to form a grid structure;
wherein the multiple first portions, the multiple second portions and the multiple third portions form lightproof areas of the black matrix;
wherein meshes of the grid structure are aperture zones of the black matrix, wherein the aperture zones are in one-to-one correspondence with the multiple pixel units;
wherein a perpendicular projection of each of the multiple scanning lines and a perpendicular projection of each of the multiple data lines on the second substrate are located in the lightproof areas of the black matrix; and
wherein a minimum width of each of the multiple first portions is X, a minimum width of each of the multiple second portions is Y, and $|X-Y| \leq 2$ µm;
wherein the multiple supporting columns are lightproof; and
wherein a perpendicular projection of each of the multiple supporting columns on the second substrate is located in at least one of the following positions without changing the aperture zones of the black matrix: a perpendicular projection of one of the multiple first portions on the second substrate, a perpendicular projection of one of the multiple second portions on the second substrate, and a perpendicular projection of one of the multiple third portions on the second substrate.

2. The display panel of claim 1, wherein X=Y.

3. The display panel of claim 1,
wherein in the second direction, a width of the perpendicular projection of each of the multiple supporting columns on the second substrate is a, and in the first direction, a width of the perpendicular projection of each of the multiple supporting columns on the second substrate is b; wherein
a>X, and/or, b>Y;
wherein in the second direction, a maximum width of the perpendicular projection of each of the multiple third portions on the second substrate is c, and in the first direction, a maximum width of the perpendicular projection of each of the multiple third portions on the second substrate is d, wherein c>a and d>b; and
wherein the perpendicular projection of each of the multiple supporting columns on the second substrate is located in perpendicular projection of one of the multiple third portions on the second substrate.

4. The display panel of claim 3, wherein each of the multiple third portions is an axisymmetric shape including at least one axis of symmetry, the at least one axis of symmetry is parallel to the multiple data lines, and/or the at least one axis of symmetry is parallel to the multiple scanning lines.

5. The display panel of claim 3, wherein |c−d|≤5 µm.

6. The display panel of claim 4, wherein a shape of each of the multiple third portions is a circle, an ellipse or a regular polygon.

7. The display panel of claim 3, wherein on the first substrate, each of the multiple pixel units comprises a thin film transistor having an active layer; and
wherein a perpendicular projection of the active layer on the second substrate is located in the perpendicular projection of one of the multiple third portions on the second substrate.

8. The display panel of claim 7, wherein on the first substrate, each of the multiple pixel units further comprises a pixel electrode;
wherein the thin film transistor further comprises a signal output terminal;
wherein the pixel electrode and the signal output terminal are connected through a via hole; and
wherein a perpendicular projection of the via hole on the second substrate is located in the perpendicular projection of one of the multiple third portions on the second substrate.

9. The display panel of claim 7, wherein
the perpendicular projection of one of the multiple supporting columns on the second substrate and the projection of the active layer of the thin film transistor on the second substrate are located in a perpendicular projection of different third portions on the second substrate respectively.

10. The display panel of claim 9, wherein perpendicular projections of the active layers of the thin film transistors in four pixel units adjacent to a same third portion, among the multiple third portions, on the second substrate are located in a perpendicular projection of said third portion on the second substrate.

11. The display panel of claim 1, wherein the second direction is perpendicular to the first direction.

* * * * *